United States Patent
Kim et al.

(10) Patent No.: US 9,761,327 B2
(45) Date of Patent: Sep. 12, 2017

(54) SEMICONDUCTOR DEVICES TO STORE TEST DATA IN MEMORY CELL ARRAY

(71) Applicant: SK hynix Inc., Icheon-si, Gyeonggi-do (KR)

(72) Inventors: Min Chang Kim, Seoul (KR); Chang Hyun Kim, Seoul (KR); Do Yun Lee, Yongin-si (KR); Jae Jin Lee, Gwangju-si (KR); Hun Sam Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/047,229

(22) Filed: Feb. 18, 2016

(65) Prior Publication Data

US 2017/0098477 A1     Apr. 6, 2017

(30) Foreign Application Priority Data

Oct. 5, 2015     (KR) .................. 10-2015-0139723

(51) Int. Cl.
*G11C 7/10* (2006.01)
*G11C 29/12* (2006.01)

(52) U.S. Cl.
CPC .......... *G11C 29/1201* (2013.01); *G11C 7/106* (2013.01); *G11C 7/109* (2013.01); *G11C 7/1063* (2013.01); *G11C 7/1087* (2013.01)

(58) Field of Classification Search
None
See application file for complete search history.

(56) References Cited

U.S. PATENT DOCUMENTS

| | | | |
|---|---|---|---|
| 7,612,574 B2 | 11/2009 | Fujiwara et al. | |
| 2012/0131397 A1* | 5/2012 | Yoshida | G11C 29/16 714/718 |
| 2012/0257461 A1* | 10/2012 | Kim | G11C 29/022 365/189.05 |
| 2014/0176169 A1* | 6/2014 | Cheng | G01R 31/2884 324/750.3 |
| 2016/0148918 A1* | 5/2016 | Ye | H01L 25/18 711/154 |

FOREIGN PATENT DOCUMENTS

KR     1020080019459 A     3/2008

\* cited by examiner

*Primary Examiner* — Son Dinh
*Assistant Examiner* — Sultana Begum
(74) *Attorney, Agent, or Firm* — William Park & Associates LTD.

(57) ABSTRACT

A first data input circuit receives test data from a first pad to generate first input control data for generating cell input data stored in a memory cell array during a first operation period. A first data output circuit receives first output control data generated from cell output data outputted from the memory cell array to output the first output control data to an internal node coupled to a second pad during a second operation period.

17 Claims, 6 Drawing Sheets

|  | T_CNT1 | T_CNT2 |
|---|---|---|
| FIRST OPERATION PERIOD | L | H |
| SECOND OPERATION PERIOD | L | L |
| THIRD OPERATION PERIOD | H | L |
| FOURTH OPERATION PERIOD | H | H |

SEMICONDUCTOR DEVICES TO STORE TEST DATA IN MEMORY CELL ARRAY

CROSS-REFERENCE TO RELATED APPLICATIONS

The present application claims priority under 35 U.S.C 119(a) to Korean Patent Application No. 10-2015-0139723, filed on Oct. 5, 2015, in the Korean Intellectual Property Office, which is incorporated herein by reference in its entirety as set forth in full.

BACKGROUND

1. Technical Field

Embodiments of the invention relate to semiconductor devices executing a test operation.

2. Related Art

A system-in-package (SiP) technique and a chip-on-chip (CoC) technique have been widely used as packaging techniques for putting a large capacity of memory chip and a controller chip in a single package. The system-in-package (SiP) technique may use a wire bonding process to electrically connect a plurality of chips to each other. The chip-on-chip (CoC) technique may be a packaging technique which is suitable for increase of a memory capacity in a single package and for improvement of a data transmission speed between the memory chip and the controller chip in a single package. This is because the memory chip and the controller chip in the package communicate with each other through micro-bump pads.

The micro-bump pads may exhibit an excellent resistance characteristic, an excellent inductance characteristic and an excellent parasitic capacitance characteristic to allow the packages to operate at a high frequency. Thus, a data transmission speed may be improved by increasing the number of the micro-bump pads employed in the package. In the chip-on-chip (CoC) package, each of the memory chip and the controller chip may be fabricated to include the micro-bump pads, and the micro-bump pads of the memory chip may be combined with the micro-bump pads of the controller chip to produce a single unified chip including the memory chip and the controller chip.

SUMMARY

According to an embodiment, a semiconductor device may include a first data input circuit that receives test data from a first pad to generate first input control data for generating cell input data stored in a memory cell array during a first operation period. The semiconductor device may also include first data output circuit that receives first output control data generated from cell output data outputted from the memory cell array to output the first output control data to an internal node coupled to a second pad during a second operation period.

According to an embodiment, a semiconductor device may include input control circuit that outputs first input control data generated from test data inputted through a first pad as cell input data stored in a memory cell array in response to first and second test control signals during a first operation period. The semiconductor device may also include output control circuit that outputs cell output data outputted from the memory cell array as first output control data which are transmitted to an internal node coupled to a second pad in response to the first and second test control signals during a second operation period.

DETAILED DESCRIPTION

Various embodiments of the invention will be described hereinafter with reference to the accompanying figures. However, the embodiments described herein are for illustrative purposes only and are not intended to limit the scope of the invention. Various embodiments are directed to semiconductor devices testing a data input circuit that receives data and a data output circuit that outputs data.

Figure 1:
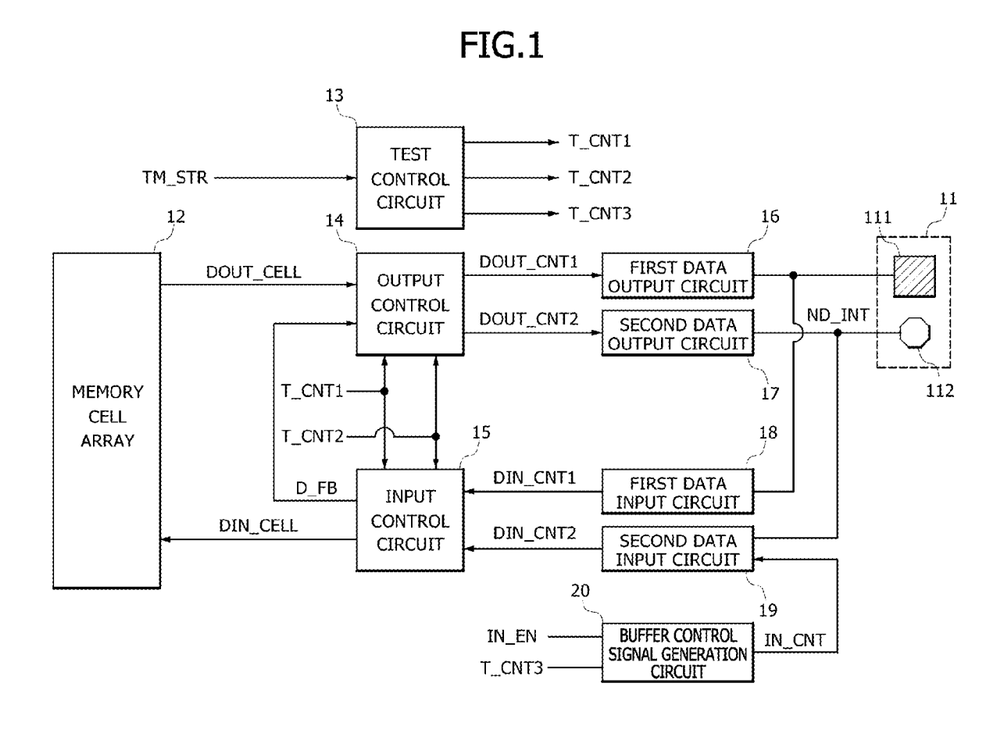
FIG. 1 is a block diagram illustrating a configuration of a semiconductor device according to an embodiment.

Referring to FIG. 1, a semiconductor device according to an embodiment may include a pad section 11, a memory cell array 12, a test control circuit 13, an output control circuit 14, an input control circuit 15, a first data output circuit 16, a second data output circuit 17, a first data input circuit 18, a second data input circuit 19, and a buffer control signal generation circuit 20. The internal components of the semiconductor device may be configured as circuits or the like.

The pad section 11 may include a first pad 111 and a second pad 112. The first pad 111 may be realized by a test pad. The first pad 111 may be probed by a probe pin to receive or output test data in a test mode for testing the semiconductor device. The second pad 112 may be realized by a bump pad. The second pad 112 may be a pad which directly electrically couples an upper chip to a lower chip of a semiconductor device including a plurality chips.

The memory cell array 12 may output cell output data DOUT_CELL and may receive cell input data DIN_CELL. The memory cell array 12 may include a plurality of memory cells. The memory cell array 12 may receive the cell input data DIN_CELL to store the cell input data DIN_CELL in the memory cell included in the memory cell array 12 while a write operation is performed. The memory cell array 12 may output the data stored in the memory cell of the memory cell array 12 as the cell output data DOUT_CELL while a read operation is performed. The cell output data DOUT_CELL may be outputted from the memory cell array 12 through input/output (I/O) lines. Further, the cell input data DIN_CELL may also be inputted to the memory cell array 12 through the I/O lines.

The test control circuit 13 may generate a first test control signal T_CNT1, a second test control signal T_CNT2 and a third test control signal T_CNT3 in response to a test mode start signal TM_STR. The test control circuit 13 may generate the first to third test control signals T_CNT1, T_CNT2 and T_CNT3 in response to the test mode start signal TM_STR which is enabled when the semiconductor device operates in a test mode. The first and second test control signals T_CNT1 and T_CNT2 may control I/O operations of the output control circuit 14 and the input control circuit 15. The first and second test control signals T_CNT1 and T_CNT2 may be generated to have various logic level combinations for controlling the I/O operations of the output control circuit 14 and the input control circuit 15. For example, the first and second test control signals T_CNT1 and T_CNT2 may be generated to have a first logic level combination during a first operation period, a second logic level combination during a second operation period, a third logic level combination during a third operation period, and a fourth logic level combination during a fourth operation period after the semiconductor device enters the test mode. The third test control signal T_CNT3 may be enabled to activate the second data input circuit 19 when the second data input circuit 19 is tested.

The output control circuit 14 may receive the cell output data DOUT_CELL or feedback data D_FB to output the cell output data DOUT_CELL or the feedback data D_FB as first output control data DOUT_CNT1 or second output control data DOUT_CNT2 according to a logic level combination of the first and second test control signals T_CNT1 and T_CNT2. In more detail, the output control circuit 14 may receive and latch the cell output data DOUT_CELL if the first test control signal T_CNT1 has a logic low level. The output control circuit 14 may receive and latch the feedback data D_FB if the first test control signal T_CNT1 has a logic high level. The output control circuit 14 may output the latched data thereof as the first output control data DOUT_CNT1 if the second test control signal T_CNT2 has a logic low level. The output control circuit 14 may output the latched data thereof as the second output control data DOUT_CNT2 if the second test control signal T_CNT2 has a logic high level. Logic levels of the first and second test control signals T_CNT1 and T_CNT2 inputted to the output control circuit 14 may be set to be different according to the embodiments.

The input control circuit 15 may receive first input control data DIN_CNT1 or second input control data DIN_CNT2 to output the first input control data DIN_CNT1 or the second input control data DIN_CNT2 as the cell input data DIN_CELL or the feedback data D_FB according to a logic level combination of the first and second test control signals T_CNT1 and T_CNT2. In more detail, the input control circuit 15 may receive and latch the second input control data DIN_CNT2 if the first test control signal T_CNT1 has a logic low level. The input control circuit 15 may receive and latch the first input control data DIN_CNT1 if the first test control signal T_CNT1 has a logic high level. The output control circuit 14 may output the latched data thereof as the cell input data DIN_CELL if the second test control signal T_CNT2 has a logic low level. The output control circuit 14 may output the latched data thereof as the feedback data D_FB if the second test control signal T_CNT2 has a logic high level. Logic levels of the first and second test control signals T_CNT1 and T_CNT2 inputted to the input control circuit 15 may be set to be different according to the embodiments.

The first data output circuit 16 may receive and buffer the first output control data DOUT_CNT1 to output the buffered first output control data DOUT_CNT1 to the first pad 111. The first data output circuit 16 may be realized have a high drivability to drive the first pad 111 corresponding to a test pad. In the test mode, the first data output circuit 16 may receive the first output control data DOUT_CNT1 corresponding to the feedback data D_FB to output the first output control data DOUT_CNT1 to the first pad 111.

The second data output circuit 17 may receive and buffer the second output control data DOUT_CNT2 to output the buffered second output control data DOUT_CNT2 to the second pad 112. In the test mode, the second data output circuit 17 may receive the second output control data DOUT_CNT2 corresponding to the cell output data DOUT_CELL outputted from the memory cell array 12 to output the second output control data DOUT_CNT2 to an internal node ND_INT electrically coupled to the second pad 112. In a normal mode, the second data output circuit 17 may receive the second output control data DOUT_CNT2 corresponding to the cell output data DOUT_CELL outputted from the memory cell array 12 to output the second output control data DOUT_CNT2 to the second pad 112.

The first data input circuit 18 may receive test data from the first pad 111 to generate the first input control data DIN_CNT1. The test data may be inputted to the first pad 111 through a probe pin from a test device.

The second data input circuit 19 may receive data of the internal node ND_INT electrically coupled to the second pad 112 to generate the second input control data DIN_CNT2 in response to an input control signal IN_CNT. In the test mode, the second data input circuit 19 may receive data of the internal node ND_INT outputted from the second data output circuit 17 to generate the second input control data DIN_CNT2. In the normal mode, the second data input circuit 19 may receive data from the second pad 112 to generate the second input control data DIN_CNT2.

The buffer control signal generation circuit 20 may receive an input enable signal IN_EN and the third test control signal T_CNT3 to generate the input control signal IN_CNT. The buffer control signal generation circuit 20 may generate the input control signal IN_CNT enabled if at least one of the input enable signal IN_EN and the third test control signal T_CNT3 is enabled during a third operation period. In the normal mode, the input enable signal IN_EN may be enabled if the write operation of the memory cell array 12 is performed. In the test mode, the third test control signal T_CNT3 may be enabled in a period that the second data input circuit 19 receives the data of the internal node ND_INT outputted from the second data output circuit 17 to generate the second input control data DIN_CNT2.

As described above, the semiconductor device according to an embodiment may receive test data from the first pad 111 to store the test data in the memory cell array 12 through the first data input circuit 18 and the input control circuit 15 during a first operation period after the semiconductor device enters the test mode. During a second operation period after the first operation period terminates, the cell output data DOUT_CELL outputted from the memory cell array 12 may output to the internal node ND_INT through the output control circuit 14 and the second data output circuit 17. During a third operation period after the second operation period terminates, the data of the internal node ND_INT may be outputted as the feedback data D_FB through the second data input circuit 19 and the input control circuit 15. During a fourth operation period after the third operation period terminates, the feedback data D_FB may be outputted to the first pad 111 through the output control circuit 14 and the first data output circuit 16.

Figure 2:
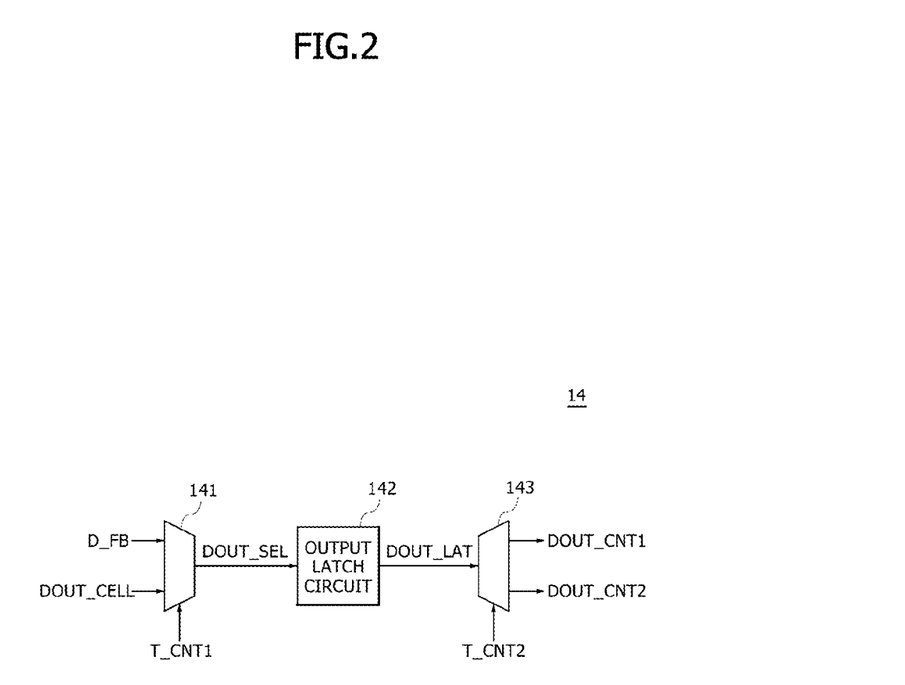
FIG. 2 is a block diagram illustrating an output control circuit included in the semiconductor device shown in FIG. 1.

Referring to FIG. 2, the output control circuit 14 may include a first output selection circuit 141, an output latch circuit 142, and a second output selection circuit 143.

The first output selection circuit 141 may select and output one of the feedback data D_FB and the cell output data DOUT_CELL as selection output data DOUT_SEL in response to the first test control signal T_CNT1. More specifically, the first output selection circuit 141 may output the feedback data D_FB as the selection output data DOUT_SEL if the first test control signal T_CNT1 has a logic high level. The first output selection circuit 141 may output the cell output data DOUT_CELL as the selection output data DOUT_SEL if the first test control signal T_CNT1 has a logic low level.

The output latch circuit 142 may latch the selection output data DOUT_SEL to generate latch output data DOUT_LAT. The output latch circuit 142 may be realized by a first-in first-out (FIFO) latch circuit.

The second output selection circuit 143 may receive the latch output data DOUT_LAT to output the latch output data DOUT_LAT as one of the first output control data DOUT_CNT1 and the second output control data DOUT_CNT2 in response to the second test control signal T_CNT2. In more detail, the second output selection circuit 143 may output the latch output data DOUT_LAT as the first output control data DOUT_CNT1 if the second test control signal T_CNT2 has a logic high level. The second output selection circuit 143 may output the latch output data DOUT_LAT as the second output control data DOUT_CNT2 if the second test control signal T_CNT2 has a logic low level.

Figure 3:
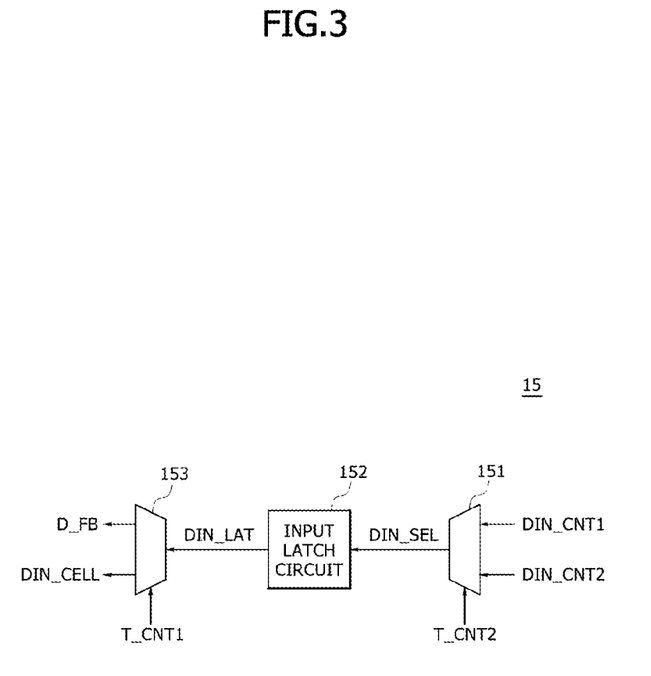
FIG. 3 is a block diagram illustrating an input control circuit included in the semiconductor device shown in FIG. 1.

Referring to FIG. 3, the input control circuit 15 may include a first input selection circuit 151, an input latch circuit 152 and a second input selection circuit 153.

The first input selection circuit 151 may select and output one of the first input control data DIN_CNT1 and the second input control data DIN_CNT2 as selection input data DIN_SEL in response to the second test control signal T_CNT2. More specifically, the first input selection circuit 151 may output the first input control data DIN_CNT1 as the selection input data DIN_SEL if the second test control signal T_CNT2 has a logic high level. The first input selection circuit 151 may output the second input control data DIN_CNT2 as the selection input data DIN_SEL if the second test control signal T_CNT2 has a logic low level.

The input latch circuit 152 may latch the selection input data DIN_SEL to generate latch input data DIN_LAT. The input latch circuit 152 may be realized by a first-in first-out (FIFO) latch circuit.

The second input selection circuit 153 may receive the latch input data DIN_LAT to output the latch input data DIN_LAT as one of the feedback data D_FB and the cell input data DIN_CELL in response to the first test control signal T_CNT1. In more detail, the second input selection circuit 153 may output the latch input data DIN_LAT as the feedback data D_FB if the first test control signal T_CNT1 has a logic high level. The second input selection circuit 153 may output the latch input data DIN_LAT as the cell input data DIN_CELL if the first test control signal T_CNT1 has a logic low level.

Figure 4:
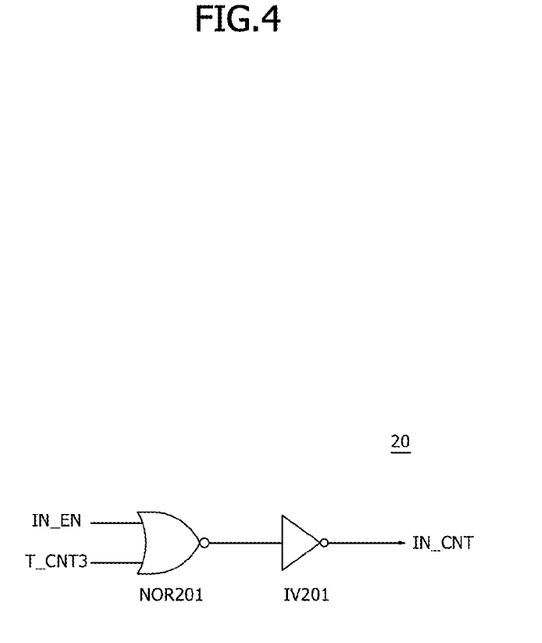
FIG. 4 is logic circuit diagram illustrating a buffer control signal generation circuit included in the semiconductor device shown in FIG. 1.

Referring to FIG. 4, the buffer control signal generation circuit 20 may include a NOR gate NOR201 and an inverter IV201 which are cascaded. The NOR gate NOR201 may receive an input enable signal IN_EN and the third test control signal T_CNT3 and may perform a NOR operation thereof. The inverter IV201 may receive an output signal of the NOR gate NOR201 and may generate the input control signal IN_CNT by inversely buffering the output signal of the NOR gate NOR201.

Figure 5:
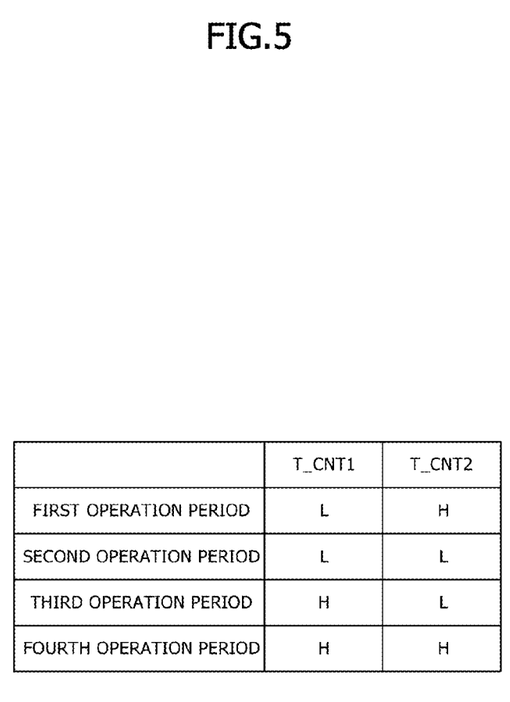
FIG. 5 is a logic table illustrating an operation of a semiconductor device according to an embodiment.

An operation of the semiconductor device having the aforementioned configuration will be described with reference to FIG. 5 in conjunction with first to fourth operation periods as described below.

If the test mode start signal TM_STR is enabled to operate the semiconductor device in the test mode, the test control circuit 13 may generate the first to third test control signals T_CNT1, T_CNT2 and T_CNT3.

During the first operation period after the semiconductor device enters the test mode, the first test control signal T_CNT1 may have a logic low level and the second test control signal T_CNT2 may have a logic high level. During the first operation period, the first data input circuit 18 may receive the test data from the first pad 111 to generate the first input control data DIN_CNT1. The input control circuit 15 may receive and latch the first input control data DIN_CNT1 in response to the second test control signal T_CNT2 having a logic high level. The input control circuit 15 may output the latched data as the cell input data DIN_CELL which is stored in the memory cell array 12 in response to the first test control signal T_CNT1 having a logic low level.

During the second operation period after the first operation period terminates, the first test control signal T_CNT1 may have a logic low level and the second test control signal T_CNT2 may have a logic low level. During the second operation period, the output control circuit 14 may receive and latch the cell output data DOUT_CELL from the memory cell array 12 in response to the first test control signal T_CNT1 having a logic low level. The output control circuit 14 may output the latched data as the second output control data DOUT_CNT2 in response to the second test control signal T_CNT2 having a logic low level. The second data output circuit 17 may receive and output the second output control data DOUT_CNT2 to the internal node ND_INT electrically coupled to the second pad 112.

During the third operation period after the second operation period terminates, the first test control signal T_CNT1 may have a logic high level and the second test control signal T_CNT2 may have a logic low level. During the third operation period, the second data input circuit 19 may receive the data of the internal node ND_INT outputted from the second data input circuit 19 to generate the second input control data DIN_CNT2. The input control circuit 15 may receive and latch the second input control data DIN_CNT2 in response to the second test control signal T_CNT2 having a logic low level. The input control circuit 15 may output the latched data as the feedback data D_FB in response to the first test control signal T_CNT1 having a logic high level.

During the fourth operation period after the third operation period terminates, the first test control signal T_CNT1 may have a logic high level and the second test control signal T_CNT2 may have a logic high level. During the fourth operation period, the output control circuit 14 may receive and latch the feedback data D_FB in response to the first test control signal T_CNT1 having a logic high level. The output control circuit 14 may output the latched data as the first output control data DOUT_CNT1 in response to the second test control signal T_CNT2 having a logic high level. The first data output circuit 16 may receive the first output control data DOUT_CNT1 to output the first output control data DOUT_CNT1 to the first pad 111.

As described above, the semiconductor device according to an embodiment may receive the test data from the first pad 111 corresponding to a test pad to store the test data in the memory cell array 12 through the first data input circuit 18. Further, the data stored in the memory cell array 12 may be outputted to the first pad 111 through the second data output circuit 17. In addition, the second data input circuit 19 electrically coupled to the second pad 112 as well as through the first data output circuit 16, in a test mode. Hence, it may be possible to evaluate or test the second data output circuit 17 and the first data input circuit 18 through which data are inputted or outputted in a normal mode.

Figure 6:
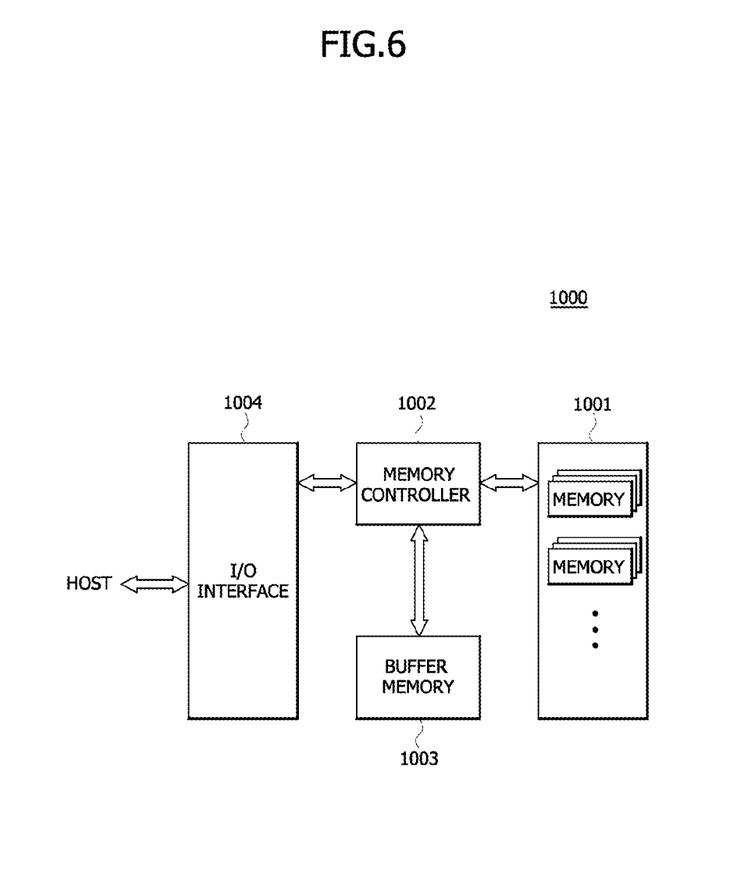
FIG. 6 is a block diagram illustrating a configuration of an electronic system including the semiconductor device shown in FIG. 1 to FIG. 5.

The semiconductor device described with reference to FIGS. 1 to 5 may be applied to an electronic system that includes a memory system, a graphic system, a computing system, a mobile system, or the like. For example, as illustrated in FIG. 6, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002 according to a control signal generated from the memory controller 1002. The data storage circuit 1001 may include the second semiconductor device which is illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 6 illustrates the memory controller 1002 with a single block, the memory controller 1002 may include one controller for controlling a nonvolatile memory and another controller for controlling the buffer memory 1003 comprised of a volatile memory.

The buffer memory 1003 may temporarily store the data which are processed by the memory controller 1002. The buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically couple the memory controller 1002 to the external device (i.e., the host). Thus, the memory controller 1002 may receive control signals and data supplied from the external device (i.e., the host) through the I/O interface 1004; and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
  a first data input circuit suitable for receiving test data from a first pad to generate first input control data for generating cell input data stored in a memory cell array during a first operation period;
  a first data output circuit suitable for receiving first output control data generated from cell output data outputted from the memory cell array to output the first output control data to an internal node electrically coupled to a second pad during a second operation period; and
  a second data input circuit suitable for directly receiving data of the internal node outputted from the first data output circuit to generate second input control data in response to an input control signal during a third operation period.

2. The semiconductor device of claim 1, wherein the input control signal is enabled in response to a first test control signal which is enabled during the third operation period.

3. The semiconductor device of claim 1, further comprising:
  a second data output circuit suitable for receiving second output control data corresponding to the second input control data to output the second output control data to the first pad during a fourth operation period.

4. The semiconductor device of claim 3, wherein the first operation period, the second operation period, the third operation period, and the fourth operation period are sequentially set in a test mode.

5. The semiconductor device of claim 1, wherein the first pad is a test pad, and the second pad is a bump pad.

6. The semiconductor device of claim 1, further comprising:
  an input control circuit suitable for receiving the first input control data or the second input control data to output the first input control data or the second input control data as the cell input data or feedback data, according to a logic level combination of a second test control signal and a third test control signal; and
  an output control circuit suitable for receiving the cell output data or the feedback data to output the cell output data or the feedback data as the first output control data or second output control data according to the logic level combination of the second test control signal and the third test control signal.

7. The semiconductor device of claim 6,
  wherein the input control circuit outputs the first input control data as the cell input data during the first operation period that the second and third test control signals has a first logic level combination; and
  wherein the input control circuit outputs the second input control data as the feedback data during the third operation period that the second and third test control signals has a second logic level combination.

8. The semiconductor device of claim 6,
wherein the output control circuit outputs the cell output data as the first output control data during the second operation period that the second and third test control signals has a third logic level combination; and
wherein the output control circuit outputs the feedback data as the second output control data during the fourth operation period that the second and third test control signals has a fourth logic level combination.

9. The semiconductor device of claim 6, wherein the input control circuit includes:
a first input selection circuit suitable for outputting one of the first input control data and the second input control data as selection input data in response to the third test control signal;
an input latch circuit suitable for latching the selection input data to generate latch input data; and
a second input selection circuit suitable for outputting the latch input data as one of the cell input data and the feedback data in response to the second test control signal.

10. The semiconductor device of claim 6, wherein the output control circuit includes:
a first output selection circuit suitable for outputting one of the cell output data and the feedback data as selection output data in response to the second test control signal;
an output latch circuit suitable for latching the selection output data to generate latch output data; and
a second output selection circuit suitable for outputting the latch output data as one of the first output control data and the second output control data in response to the third test control signal.

11. A semiconductor device comprising:
an input control circuit suitable for outputting first input control data generated from test data inputted through a first pad as cell input data stored in a memory cell array in response to first and second test control signals during a first operation period;
an output control circuit suitable for outputting cell output data outputted from the memory cell array as first output control data which are transmitted to an internal node electrically coupled to a second pad in response to the first and second test control signals during a second operation period, wherein the input control circuit outputs second input control data generated in response to data of the internal node as feedback data during a third operation period; and
a first data input circuit suitable for directly receiving data of the internal node to generate the second input control data.

12. The semiconductor device of claim 11, further comprising:
a second data input circuit suitable for receiving the test data inputted through the first pad to generate the first input control data; and
a first data output circuit suitable for receiving the first output control data to output the first output control data to the internal node.

13. The semiconductor device of claim 11, wherein the output control circuit outputs the feedback data as second output control data which are transmitted to the first pad during a fourth operation period.

14. The semiconductor device of claim 13, further comprising:
a second data output circuit suitable for receiving the second output control data to output the second output control data to the first pad.

15. The semiconductor device of claim 13, wherein the first operation period, the second operation period, the third operation period and the fourth operation period are sequentially set in a test mode.

16. The semiconductor device of claim 11, wherein the input control circuit includes:
a first input selection circuit suitable for outputting one of the first input control data and the second input control data as selection input data in response to the second test control signal;
an input latch circuit suitable for latching the selection input data to generate latch input data; and
a second input selection circuit suitable for outputting the latch input data as one of the cell input data and the feedback data in response to the first test control signal.

17. The semiconductor device of claim 11, wherein the output control circuit includes:
a first output selection circuit suitable for outputting one of the cell output data and the feedback data as selection output data in response to the first test control signal;
an output latch circuit suitable for latching the selection output data to generate latch output data; and
a second output selection circuit suitable for outputting the latch output data as one of the first output control data and second output control data in response to the second test control signal.

* * * * *